United States Patent [19]

Paunovic

[11] 4,303,798

[45] Dec. 1, 1981

[54] HEAT SHOCK RESISTANT PRINTED CIRCUIT BOARD ASSEMBLIES

[75] Inventor: Milan Paunovic, Port Washington, N.Y.

[73] Assignee: Kollmorgen Technologies Corporation, Dallas, Tex.

[21] Appl. No.: 34,210

[22] Filed: Apr. 27, 1979

[51] Int. Cl.³ .............................................. H05K 1/09
[52] U.S. Cl. ................................... 174/68.5; 427/97; 427/98; 428/901
[58] Field of Search ............... 174/68.5; 156/901, 902; 427/97, 98; 428/901

[56] References Cited

U.S. PATENT DOCUMENTS

| | | | |
|---|---|---|---|
| 3,514,538 | 5/1970 | Chadwick | 174/68.5 |
| 3,959,523 | 5/1976 | Grunwald | 427/98 |
| 4,047,290 | 9/1977 | Weitze | 174/68.5 X |
| 4,104,111 | 8/1978 | Mack | 174/68.5 X |

OTHER PUBLICATIONS

"Encapsulayer," Photocircuits Corp., Technical Bulletin, 2 pp., Glen Cove, N.Y.
Haddad et al., Printed Circuits With Diverse Metallic Topography, IBM Tech. Bull., vol. 13 #1, Jun. 1970 pp. 124 & 125.

Primary Examiner—Richard R. Kucia
Attorney, Agent, or Firm—Morgan, Finnegan, Pine, Foley & Lee

[57] ABSTRACT

The heat shock resistance of plated through holes in printed circuit assemblies is significantly increased by using as the through hole plating a special multi-layered arrangement comprising at least two layers of an electrically conductive metal in combination with at least one intermediate layer of a different electrically conductive metal. In preferred embodiments, the through hole plating comprises at least two layers of a stressed metal together with at least one intermediate layer of a metal having a stress in counteraction to that of one or more of the other metal layers. These through hole platings are capable of exposure to conditions of heat shock, such as encountered during high temperature soldering, without developing cracks resulting in breaks in the conducting pathways and failures.

9 Claims, 11 Drawing Figures

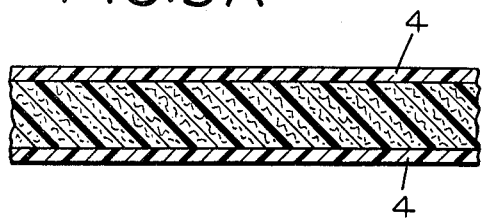
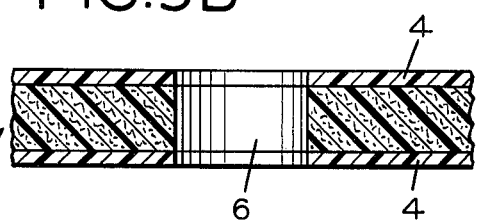
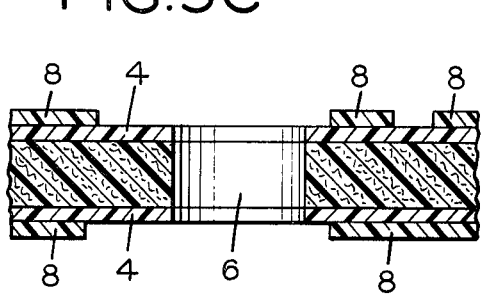
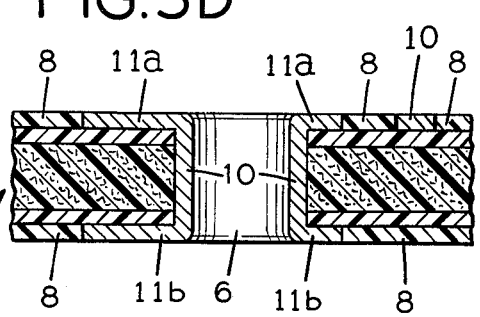
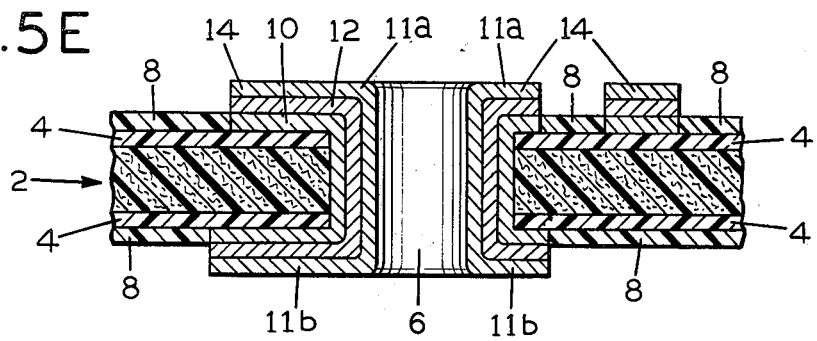
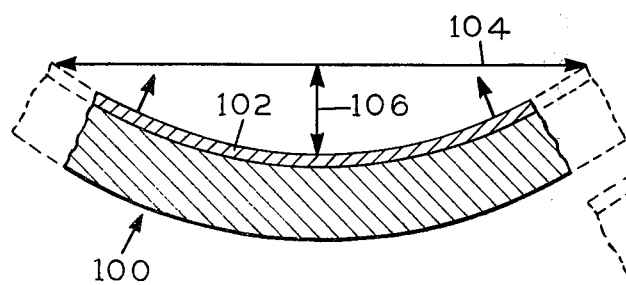
TENSILE STRESS (+)
INTERNAL STRESS MEASUREMENT
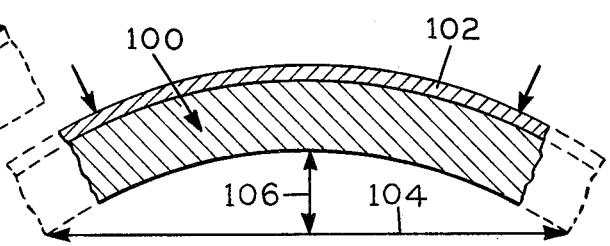
COMPRESSIVE STRESS (−)
INTERNAL STRESS MEASUREMENT

HEAT SHOCK RESISTANT PRINTED CIRCUIT BOARD ASSEMBLIES

BACKGROUND OF THE ART

In printed circuit board manufacture, the surface or selected areas of the surface of an insulating base are treated to render them receptive to the deposition of metal from an electroless plating solution. In one type of procedure, portions of the surface of the insulating base are sensitized in the form of a desired printed circuit pattern and copper is deposited on the sensitized areas, as by electroless means alone or in combination with electroplating, to form the desired pattern of conductor lines. In another type of procedure, a layer of an adhesion promoting adhesive is interposed between the insulating base and the metal deposit.

In the typical case, through holes are provided in the insulating base, as by drilling or punching, for purposes of forming interconnections and the hole walls are sensitized for metal deposition. On the other hand, the insulating base can be made in whole or in part of a material already catalytic to the electroless deposition of metal and when the holes are formed the catalytic material becomes exposed, thus dispensing with the need for sensitization.

Because the through hole plating and insulating substratum have different coefficients of expansion, the hole wall metal expands or contracts at a different rate than the substratum when the board is exposed to unusually high or low temperature conditions varying from the ambient. This sometimes results in the development of cracks or fissues in the hole wall plating leading to breaks in the conducting pathways and failures during use. The metal deposit is also characterized by an internal stress, which contributes toward crack formation. Metals of relatively low ductility especially are susceptible to cracking when highly stressed.

This problem of crack formation is encountered during high temperature soldering operations in printed circuit board manufacture. In one such procedure, solder is applied, as by floating on a solder bath or by passage over a solder wave, to each of the through holes to which circuit components such as integrated circuits, resistors, capacitors, and the like are later attached. The solder also helps to prevent the metallized hole walls from corroding which can occcur if the circuit boards are stored for periods of time before attachment of the aforementioned circuit components.

In another such soldering operation, after imposing the circuit pattern and coating the panel except the through holes with a mask comprising a solder resist, the board is immersed in a solder bath and solder is permitted to substantially fill the holes, and while the solder is still molten the excess is blown out of the holes leaving a thin layer of solder coating the hole walls.

In subsequent stages of manufacture, molten solder is applied to substantially fill the remainder of the holes contaning component lead and thus affix the components to the board.

These solder treatments, even though brief, often induce heat shock and cause cracks to form in the through hole platings rendering the boards susceptible to failure as previously explained.

OBJECTS OF THE INVENTION

It is an object of this invention to reduce the incidence of crack formation in through hole platings.

It is another object of this invention to provide a method of increasing the heat shock resistance of through hole platings in printed circuit board manufacture.

It is a further object of this invention to provide printed circuit board assemblies which are less suceptible to failure resulting from heat shock effects.

Additional objects of this invention will be apparent from the following description and from the examples.

DESCRIPTION OF THE INVENTION

In its broadest aspects, the invention provides an improvement for increasing the heat shock resistance of the through hole platings in printed circuit boards comprising using as the through hole plating at least two layers of an electrically conductive metal in combination with at least one intermediate layer of a different electrically conductive metal.

In preferred forms, the through hole plating comprises three metal layers in which the intermediate layer is characterized by an internal stress opposite to, i.e., in counteraction to, that of the first and/or third metal layer(s). This feature is usually employed in cases where the metal layers are deposited by electroplating, but not necessarily only in such cases.

In a particularly preferred embodiment of this invention, the through hole plating comprises three metal layers: a first layer and a third layer each consisting of copper, and a second (intermediate) layer therebetween consisting of nickel. In a more preferred form, especially for those cases where the metal deposits are applied by electrolytic means, the copper layers are compressive stressed and the nickel layer is tensile stressed.

The terms "stress" or "stressed" refer to the physical phenomenon in which a metal strip, insulated or masked against metal deposition on one side, deflects and assumes a bow-like shape upon being coated on the non-insulated or unmasked side with a metal deposit.

Such stresses are more specifically referred to as compresssive (contractile) and tensile (expansive), these terms denoting counteracting physical forces.

The term "compressive (contractile) stress" herein refers to those cases in which in the foregoing situation the metal deposit bends the strip to form a convex bow, or stated another way, the metal deposit is on the outside of the bow. The term "tensile (expansive) stress" refers to those cases in which the metal deposit bends the strip to form a concave bow, i.e., the metal deposit is on the inside of the bow.

As a general rule, most electroless copper deposits are compressive stressed and most other metal deposits, i.e., electroless and electrolytic, are tensile stressed.

The degree of concave or convex bow-out is directly related to the magnitude of the tensile or compressive stress and is measurable in known ways. One method of measurement is described in the examples.

In general, the metals of the through hole plating layers are selected from among Groups IVA, IB and VIII of the Periodic Table of the Elements. By way of illustration, these include copper, nickel, gold, tin, lead, silver, palladium, platinum, osmium, iron, cobalt, rubidium and the like. Preferably, copper, nickel, gold and tin are used.

The metals are deposited in the prescribed arrangement by use of standard electroless and/or electrolytic deposition techniques.

The individual metal layer thicknesses are subject to wide variation within the preferred range of from about 2.5 to about 35 micrometers (microns). It is to be understood that the particular metal layer thickness is not especially important, but that the results obtained with this invention are attributable to the unique laminar arrangement described.

The steps in typical procedures for making articles according to this invention are illustrated in FIGS. 1, 2, 3 and 4, which are simplified flow sheets.

With reference to FIG. 1, printed circuit boards are formed in accordance with this invention as follows:

(1) Drill or punch holes is an insulating panel where electrical interconnections are desired.

(2) Sensitize the hole walls and the panel surfaces.

(3) Mask with plating resist the area of the sensitized panel surfaces not corresponding to the desired circuit pattern.

(4) Deposit a first (innermost) layer of electrically conductive metal on the sensitized areas, including the hole walls.

(5) Deposit a second (intermediate) layer of conductive metal on the first metal layer—the second metal being different than the first.

(6) Deposit a third (outermost) layer of conductive metal on the second metal layer—this metal being the same as the first.

(7) Optionally, remove mask.

In a preferred variation of the foregoing procedure, a layer of adhesion promoting adhesion is included on the panel surface before metal deposition, as illustrated in FIG. 2.

The resulting articles can be sold in commerce as such and solder applied subsequently, or solder can be applied before commercial shipment as by the following procedure, illustrated in FIG. 3 (in which dotted lines indicate optional step).

(1) Impose circuit pattern on panel surface, such as by standard print and etch techniques or fully additive methods.

(2) Apply solder mask and over entire surface.

(3) Drill or punch holes in panel.

(4) If a catalytic base is used for the panel, sensitize the hole walls (If the base is not catalytic, this sensitizing step is not necessary).

(5) Deposit the through hole plating in the described multi-layered arrangement.

(6) Apply solder in the holes and on the pads (lands) on the panel surface surrounding the holes.

By the term "print and etch" there is meant that, in accordance with standard procedures well known in the art, a panel surface is provided with a thin layer of copper, as by laminating copper foil thereon or sensitizing the surface and depositing copper electrolessly, areas corresponding to the desired circuit pattern are printed with an etch resist, copper is etched away from the unprinted areas, the etch resist is removed and the remaining copper is built up to the desired thickness, such as by electroplating or further electroless plating, to produce the desired circuit pattern on the panel surface on one or both sides.

By the term "fully additive", there is meant that, also in accordance with well known procedures, the panel surface is sensitized, areas not corresponding to the desired circuit pattern are masked, copper is deposited electrolessly on the unmasked (exposed) sensitized areas and built up to the desired thickness to form the circuit pattern on one or both sides of the panel.

In carrying out the procedure of FIG. 3, it is preferred to use a non-registered solder mask of the type described in U.S. Pat. No. 3,799,802, the disclosure of which is incorporated herein by reference.

Instead of the procedure illustrated in FIG. 3, the procedure illustrated in FIG. 4 can be followed.

(1) Drill or punch holes in panel. (2) If necessary (e.g., where base is not catalytic), sensitize the hole walls.

(3) Impose circuit pattern on panel surface, such as by the print and etch or fully additive methods referred to above.

(4) Apply solder mask over entire surface, but leaving holes and pads exposed.

(5) Deposit, in sequence, each of the metal layers of the through hole plating on the hole walls.

(6) Apply solder in the holes and on the pads (lands) on the panel surface surrounding the holes.

The body comprising the insulating base can be shaped from a thermoplastic resin, such as styrene resins, acrylonitrile-butadiene-styrene terpolymers (ABS resins), cellulose acetate, nylons, polytetrafluoroethylene, polyethylene and polypropylene, butyl rubber, polycarbonates, polyphenylene ethers, polysulfones, and the like. Also suitable are thermosetting resins such as epoxies, polyesters, phenolics, and the like.

In addition, the body can have an insulating core and a resinous layer adhered to the core by heat-curing. These are known in the art and many examples are described in Stahl, U.S. Pat. No. 3,625,758, incorporated herein by reference. The insulating base in such bodies can be, for example, a phenolic-paper, epoxy-paper, epoxy-fiberglass, polyester-fiberglass or similar laminate. The adherent resinous layer is normally present in a thickness, when dry, of about 20 to 30 microns or more. Such resinous layers can comprise, for example, an epoxy resin, a phenol-formaldehyde condensation product, a nitrile rubber in a curable composition, melamine, polyacrylic, polyester, natural rubber or curable polystyrene resin, and the like, which has been applied to the insulating core in a partially hardened state such as by transfer coating and then cured.

The adherent resinous layer can include finely divided particles consisting of oxidizable and degradable synthetic or natural rubber which have been treated with a strong oxidizing agent such as chromo-sulfuric acid, i.e., Cr(VI) in sulfuric acid, or permanganate solutions to promote the activation of metal bonding sites. Such articles are disclosed in U.S. Pat. No. 3,625,758, referred to above.

Alternatively, a catalytic base can be used. The catalytic base for the printed circuit board, in its preferred embodiment, comprises a resinous material which is catalytic throughout its interior to the deposition of metal. Typical formulations for catalytic bases suitable for use in this invention are set forth in Schneble, Jr., et al, U.S. Pat. No. 3,259,559, incorporated herein by reference to save detail.

The catalytic insulating base can be prepared by dissolving or dispersing the catalytic agent, e.g., metal or metal salt, in an insulating material which may then be formed into a three-dimensional object, as by molding. When holes or apertures are formed in the article, the surrounding walls are catalytic and metal will deposit electrolessly thereon without the need for pretreatment with sensitizers.

FIGS. 5A–E illustrate a printed circuit board in accordance with this invention, shown in different stages of manufacture.

In FIG. 5A, there is shown insulating base 2 coated on both surfaces with adhesive 4.

FIGS. 5B and 5C illustrate modified embodiments of the adhesive coated blank shown in FIG. 5A. In FIG. 5B, insulating base 2 has been drilled with through hole 6 extending completely therethrough. In FIG. 5C, insulating base 2, having adhesive 4 and through hole 6, has been printed with plating resist 8, which has been selectively applied to those areas not corresponding to the desired circuit pattern, leaving exposed those areas corresponding to the desired circuit pattern as well as the walls of through hole 6.

In FIG. 5D, first metal layer 10 has been deposited on the areas of the panel surface not coated with plating resist 8, including the walls of through hole 6 and pads 11A and 11B surrounding through hole 6.

In FIG. 5E, second metal layer 12, consisting of a metal different from first metal layer 10, and third metal layer 14, consisting of the same metal as first metal layer 10, have been sequentially deposited on first metal layer 10 to complete the circuit pattern and through hole plating.

If the surface is not inherently receptive to the deposition of electroless metal (such as in those cases where there is no catalyst such as a precious metal, e.g., palladium, included in the resinous body), then after pretreatment to promote the activation of bonding sites, it will be necessary to include a step for rendering the activated surface receptive to electroless metal prior to contacting with the metal deposition bath, as those skilled in the art will understand. Among the well known methods are sequential processes such as by immersing the body first in a solution of stannous chloride ($SnCl_2$) followed by immersing in an acidic solution of precious metal, e.g., palladium chloride ($PdCl_2$). Alternatively, sensitization can be achieved by using an acidic solution prepared from both stannous chloride and a precious metal chloride, such as palladium chloride, the stannous chloride being present in stoichiometric excess with respect to the precious metal chloride. These also are well known in the art.

Following pretreatment and/or sensitization, in practice the surface to be plated is immersed in or otherwise exposed to an electroless metal bath and permitted to remain in the bath until a metal deposit of the desired thickness has been built up on the selected areas of the surface and on the hole walls.

Electroless and electrolytic metal deposition solutions which deposit stressed metals are well known in the art. Special mention is made of electroless copper solutions employed in the preparation of printed circuit boards. Typically, these comprise an aqueous solution containing copper ions, a complexing agent or agents for such ions and a reducing agent or agents. For purposes of enhancing the ductility of the copper deposit, small effective amounts of ductility promoters can also be included in the solutions. Examples of such ductility promoters include cyanide compounds, e.g., alkali cyanides such as sodium or potassium cyanide, usually employed in amounts of between 1 and 100 milligrams per liter of deposition solution, or the polyalkylene oxides or vanadium pentoxide.

The inclusion of a cyanide compound or other ductility promoter in an electroless metal deposition bath will normally produce a copper deposit having a relatively lower compressive stress, while the omission of such agents will normally produce a copper deposit having a relatively higher compressive stress.

The copper ion is normally supplied in the form of a water soluble copper salt, e.g., copper sulfate, copper chloride, copper bromide, copper nitrate, copper acetate, and the like. Normally water insoluble compounds, such as copper oxide or copper hydroxide, can instead be used because these are rendered soluble by the complexing agent in the deposition solution.

Suitable complexing agents include Rochelle salts, the sodium salts of ethylenediaminetetraacetic acid (EDTA), nitrilotriacetic acid and its alkali salts, gluconic acid, gluconates and alkanolamines.

The reducing agents for the electroless copper solution are selected from among borohydrides, amine boranes, and formaldehyde and formaldehyde precursors such as paraformaldehyde and trioxane.

Other deposition bath ingredients, such as stabilizers, wetting agents, ductility promoters, plating rate accelerating agents and the like, can be added for their conventional functions.

Electroless copper solutions which may be used are described in U.S. Pat. No. 3,095,309, incorporated herein by reference.

Electroless nickel baths which may be used are described in Brenner "Metal Finishing", November, 1954, pages 68–76 and in U.S. Pat. No. 3,062,666 and U.S. Pat. No. 2,942,990, all of which are incorporated herein by reference.

Electroless gold plating baths which may be used are disclosed in U.S. Pat. No. 2,976,181, U.S. Pat. No. 3,589,916 and U.S. Pat. No. 3,396,042, all incorporated herein by reference.

Preferred formulations for the copper, nickel, and gold baths are as follows:

| ELECTROLESS COPPER SOLUTION | |
| --- | --- |
| copper salt, preferably cupric sulfate | 0.002 to 1.20 mols |
| reducing agent, preferably formaldehyde | 0.03 to 3 mols |
| cupric ion complexing agent | 0.05 to 20 times the mols of copper |
| alkali metal hydroxide pH adjustor, preferably sodium hydroxide | to give pH of from 10.0 to 14.0, preferably 11 to 14.0 measured at room temperature, e.g., 25° C. |
| water | to make 1 liter |

This results in a compressive stressed copper deposit. Since a less compressive stressed deposit is normally desired, a small amount of a cyanide compound, e.g., 30–50 milligrams of potassium cyanide per liter, is added.

| ELECTROLESS NICKEL SOLUTION | |
| --- | --- |
| nickel salt, preferably nickelous chloride or nickelous sulfate | 0.01 to 0.2 mols |
| reducing agent, preferably dimethylamine borane | 0.01 to 1 mol |
| nickel ion complexing agent, preferably citric acid, lactic acid or glycolic acid | 0.01 to 0.5 mol |
| pH adjustor, preferably sulfuric acid or sodium | to give pH of from 4 to 9, measured at |

| ELECTROLESS NICKEL SOLUTION | |
|---|---|
| hydroxide | room temperature, e.g., 25° C. |
| water | to make one liter |

Electroless gold plating solutions which may be used are disclosed in U.S. Pat. No. 2,976,181. In general, these contain a slightly water soluble gold salt, e.g., gold cyanide, a reducing agent therefor, e.g., hypophosphite, and a complexing agent, e.g., sodium or potassium cyanide. The bath is preferably operated at a pH of between about 13 and 14.

In place of electroless gold solutions of the foregoing type, a standard gold displacement solution may be used. One preferred formulation comprises 5 grams per liter of gold cyanide ($AuCN_2$), 5 grams per liter of sodium hydroxide (NaOH), 60 grams per liter of potassium cyanide (KCN), 3 grams per liter of sodium sulphite ($Na_2SO_3$), the balance comprising water. The bath is preferably operated at 60° C.

Instead of electrolessly formed metal deposits for the through hole platings, the respective metal layers can be formed by electroplating, using formulations and procedures well known in the art.

This invention also includes printed circuit boards having a multiplicity of through holes plated in the arrangement described.

The procedures, materials and articles of this invention are illustrated by the following examples. These are not intended to be limiting.

DESCRIPTION OF THE SPECIFIC EMBODIMENTS

Figure 1:
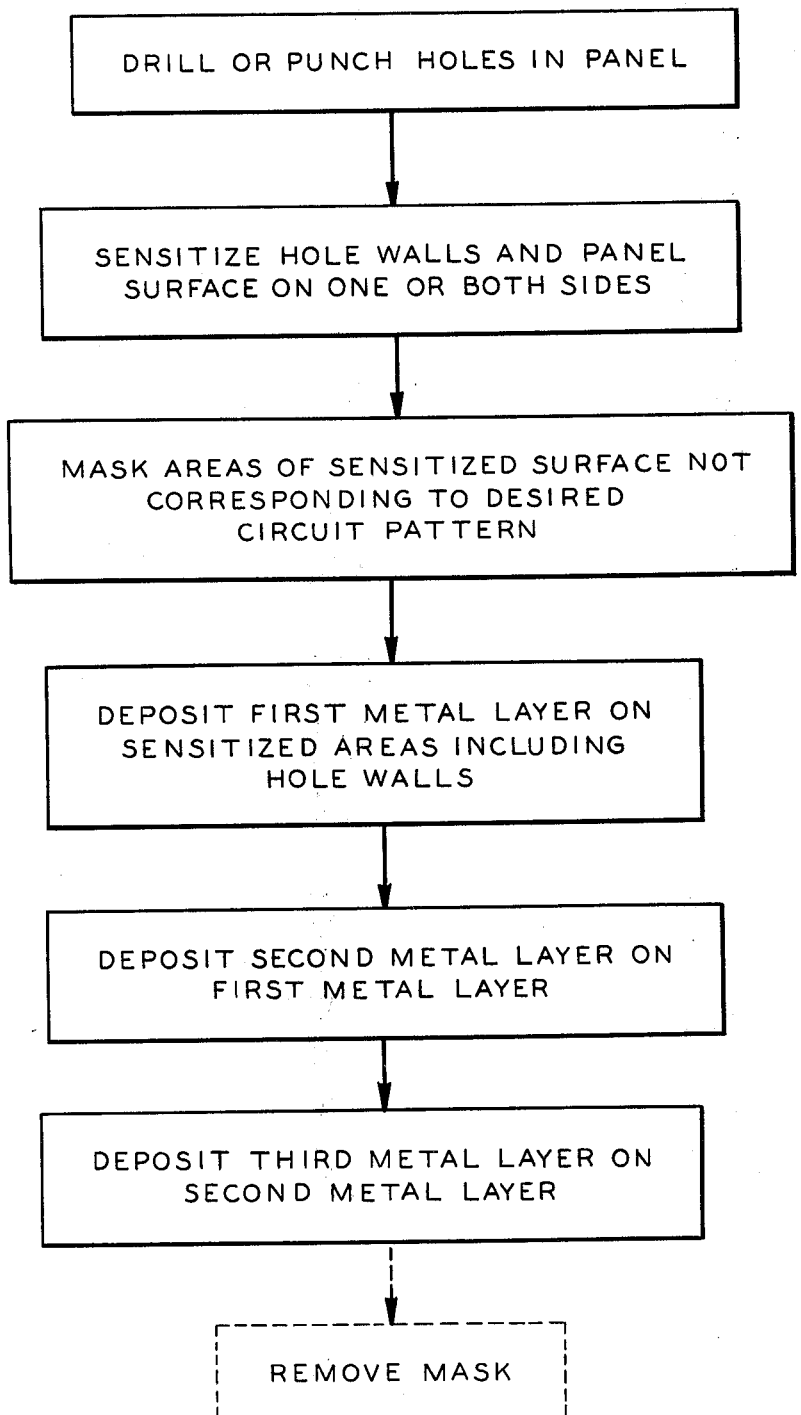
Figure 2:
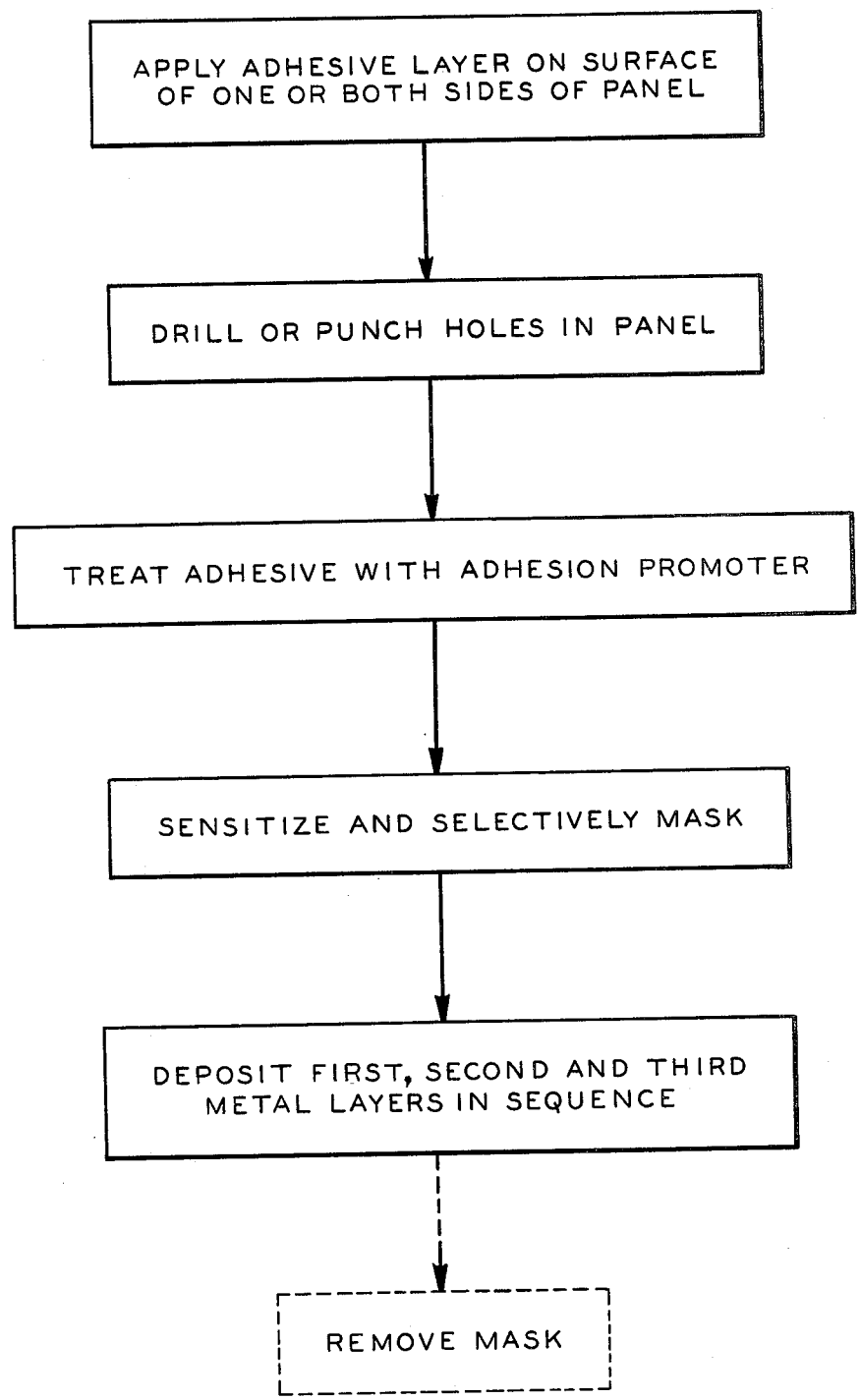
Figure 3:
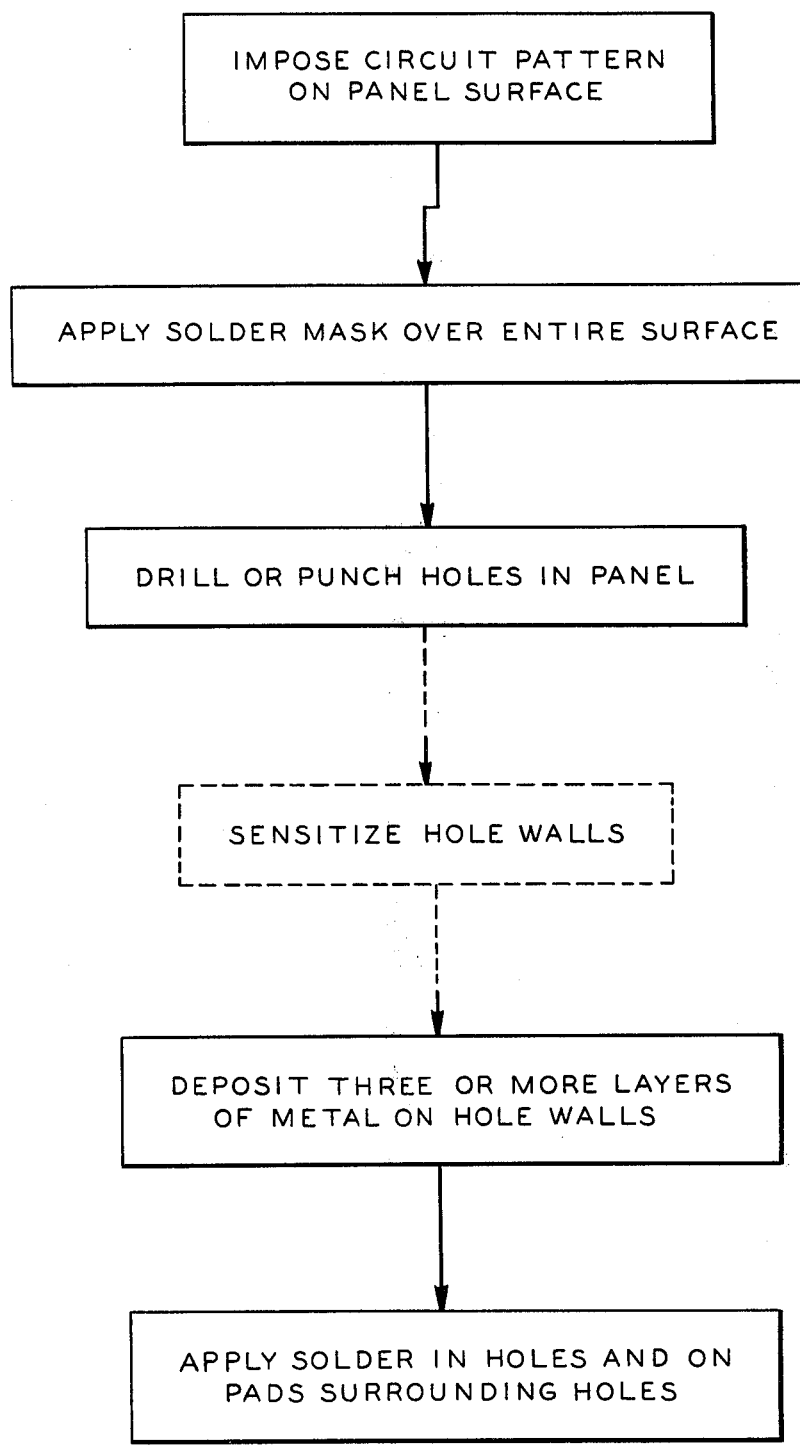
Figure 4:
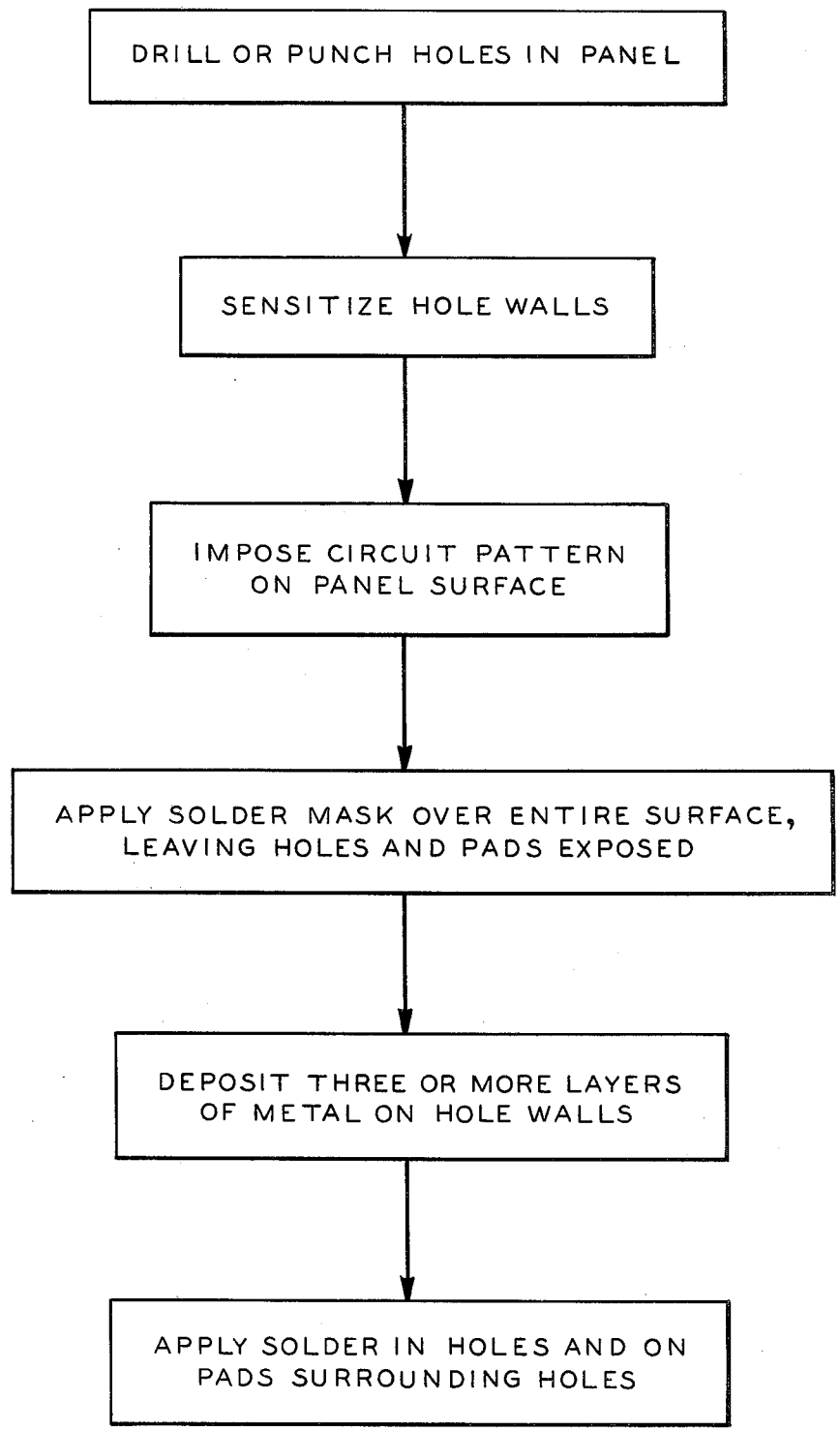

Compressive stress and tensile stress are measured using the following procedure:

INTERNAL STRESS MEASUREMENT

Take copper strip having a thickness of 0.2 millimeter, a width of 15 millimeters and a length of 152 millimeters. Treat to remove surface dirt, as by contacting with an aqueous solution of ALTREX, BASF-Wyandotte Corp., and thereafter rinse with water. Mask one side with plating resist, such as RISTON, DuPont dry film material. Immerse copper foil in electroless metal deposition bath and plate on unmasked side contemporaneously with insulating panels, resinous part or other workpiece.

The copper strip will assume a bow-like shape. If the metal deposit bends the copper strip to form a convex bow, this indicates the formation of a compressive stressed copper deposit on the copper strip and on the article being plated. If the metal deposit bends the copper strip to form a concave bow, this indicates the formation of a tensile stressed metal deposit on the copper strip and on the article being plated. See FIGS. 6A and 6B, in which 100 is the basis metal (i.e., the copper strip), 102 is the deposited metal, 104 is the length of the plated strip ("1" in this formula below), and 106 is the net change in bow at the center of the strip ("$\Delta L$" in the formula below).

The amount of stress in either case is computed from the following formula:

$$STRESS = \frac{4}{3E} \cdot \frac{(t^2 + td)}{dl^2} \Delta L$$

E = Young's Modulus Basis Metal
d = Deposit thickness
t = Strip thickness
L = Length of plated strip
$\Delta L$ = Net change in bow at center of strip (using optical comparator)

For reference, see Parker and Shah, Plating, 58, 230 (1971).

Values for the stress in the examples are indicated in units of megaPascals (MPa).

EXAMPLE 1

An insulating panel comprising a flame retardant phenolic paper laminate having a thickness of 1.6 millimeters is provided on both sides with a surface layer of adhesive in a thickness, when dry, of 25 micrometers and having the following composition:*
*See Stahl, U.S. Pat. No. 3,625,758, EXAMPLE II

| | |
|---|---|
| Methyl ethyl ketone | 415 grams |
| Cellosolve acetate | 2,375 grams |
| Nitrile rubber, liquid | 590 grams |
| Nitrile rubber, in lumps | 350 grams |
| Oil-soluble phenol resin, thermal setting | 350 grams |
| Epoxy resin (epichlorohydrin derivative) | 400 grams |
| $SiO_2$, finely divided | 300 grams |
| Butyl carbitol | 1,830 grams |
| Viscosity about 600 cps. at 22° C. | |

The adhesive-coated laminate is then drilled with multiple through holes, each hole having a diameter of one millimeter. The surface of the adhesive layer is made microporous by contacting for 15 minutes with a chromo-sulfuric acid solution comprising 100 grams per liter of $CrO_3$ and 500 grams per liter of $H_2SO_4$, the balance being water. After this acid treatment, the surface is neutralized by immersing in a 1% solution of bisulfite ($Na_2S_2O_5$) and immersed in cold running water.

Thereafter, the adhesive surface and the through holes are sensitized to the electroless deposition of metal by contacting for 5 minutes at 25° C. with Oxytron Activator 316, a palladium chloride/tin chloride sensitizing solution available from Sel-Rex Co., Division of OMF Corp., Nutley, N.J.

After sensitizing, the surface is rinsed briefly with water, contacted for 5 minutes with 5% fluoroboric acid solution to remove excess tin salt, again rinsed with water and dried.

After drying, the panel surface is selectively masked with RISTON, DuPont dry film acrylate photoresist, leaving exposed the through hole walls and the areas of the panel surface corresponding to the desired circuit pattern.

After this masking, the panel is immersed for 10 hours at 70° C. in an electroless copper deposition solution maintained at the following composition:

| | |
|---|---|
| $CuSO_4 \cdot 5H_2O$ | 10 grams |
| formaldehyde (37%) | 4 milliliters |
| wetting agent | 0.2 gram |

| | |
|---|---|
| tetra-sodium salt of EDTA | 35 grams |
| sodium hydroxide (NaOH) | to pH 11.7 |
| sodium cyanide (NaCN) | 0.005 gram |
| water | to make 1 liter |

A copper layer having a thickness of 20 micrometers is thus deposited on the exposed areas of the panel surface and on the through hole walls.

The panel is then immersed for one hour, at 50° C., in an electroless nickel deposition solution having the following composition:

| | |
|---|---|
| nickelous chloride (NiCl$_2$) | 35 grams |
| dimethylamine borane | 2 grams |
| lactic acid | 8.5 grams |
| sodium citrate | 5 grams |
| ammonium hydroxide (28%) | 8 milliliters |
| water | to make 1 liter |
| pH | 7.2 |

This results in a nickel layer, thickness 4.8 micrometers, on those areas corresponding to the copper layer.

After drying, a copper layer is deposited on the nickel layer by immersing the panel for 16 hours at 70° C. in an electroless copper deposition solution having the composition indicated above. This results in a copper deposit having a thickness of 33 micrometers.

The Riston masking material is removed by spraying with dichloromethane in a conventional conveyorized stripping device. The resulting printed circuit board has a through hole plating as follows:

| Layer | Metal | Thickness, micrometers |
|---|---|---|
| First | copper | 20 |
| Second | nickel | 4.8 |
| Third | copper | 33 |

For purposes of comparison, the procedure is repeated except that the panel is immersed in the copper deposition solution only and a single layer of copper is deposited in a thickness of 53 micrometers.

The panels are treated with solder and evaluated for heat shock resistance using the following procedure:

The panels are immersed in a solder bath at 260° C., three times, 10 seconds each time, and thereafter allowed to cool to room temperature. Fifty through holes from each board are then cross-sectioned and examined microscopically at 500 times magnification using a Leitz metallograph. It is observed that in the case of the panel produced in accordance with this invention and comprising a three-layered through hole plating, only two holes out of the fifty (4%) have cracked platings, while in the case of the comparison panel wherein the through hole plating consists of a single layer of copper, twenty-two holes out of the fifty (44%) have cracked platings.

It is shown that the multi-layered through hole plating arrangement in accordance with this invention significantly increases the heat shock resistance of the plating.

EXAMPLES 2-3

Using the procedure described in Example 1, panels comprising three-layered through hole platings in accordance with the invention are prepared and compared with their single metal-layer coated counterparts. The internal stress of each of the deposited metal layers is measured using the procedure described above. After plating, the panels are annealed by heating at 160° C. for one hour and cooling to room temperature. The same solder treatment and microscopic inspection as in Example 1 is employed.

| EXAMPLE | 2 | 2A* | 3 | 3A* |
|---|---|---|---|---|
| Metal Deposit | | | | |
| First | copper (8.1 microns) | copper (32.5 microns) | copper (16.2 microns) | copper (32.5 microns) |
| Second | nickel (4.1 microns) | — | nickel (4.1 microns) | — |
| Third | copper (16.2 microns) | — | copper (16.2 microns) | — |
| STRESS** | | | | |
| First | −62.7 | −62.7 | −34.5 | −34.5 |
| Second | +110.3 | — | +110.3 | — |
| Third | −62.7 | — | −13.8 | — |
| Percent cracked through holes | 4 | 100 | 4 | 100 |

*control experiment in the sense that a single metal layer is used
**+denotes tensile stress
−denotes compressive stress The difference in result as between 2 and 3 is probably attributable to the difference in the overall thickness of the respective through hole platings. In either case, it is demonstrated that the heat shock resistance is improved tremendously in comparison with the single layered counterpart (2A and 3A, respectively).

EXAMPLE 4

The procedure of Example 1 is repeated except that the following electroless nickel deposition solution is used to form the nickel layer:

| | |
|---|---|
| nickelous sulfate (NiSO$_4$ . 6H$_2$O) | 30 grams |
| dimethylamine borane | 2 grams |
| sodium citrate | 30 grams |
| sodium hydroxide (NaOH) | to pH 6.0–8.0 |
| water | to make 1 liter |
| temperature | 50–65° C. |

Good results are again obtained.

It can be seen that the use of a three-layered through hole plating in accordance with the invention results in a tremendous increase in the ability of the through hole platings to resist cracking upon being subjected to conditions of heat shock.

The invention in its broadest aspects is not limited to the specific steps, procedures and materials described, but it is to be understood that departures may be made therefrom while keeping within the scope of the accompanying claims and without departing from the principles of the invention or sacrificing its chief advantages.

I claim:

1. In a method of printed circuit board manufacture, the improvement for increasing the heat shock resistance of the through hole plating comprising using as said plating at least two layers of an internally stressed electrically conductive metal, each such layer having a thickness of from about 2.5 to about 35 microns, in combination with at least one intermediate layer of a different electrically conductive metal having an internal stress in counteraction to that of said other metal layers.

2. The method of claim 1 in which the metal of the through hole plating is selected from among copper, nickel, gold and tin.

3. In a method of printed circuit board manufacture, the improvement for increasing the heat shock resistance of the through hole plating comprising using as said plating a three-layered arrangement in which the first and third layers each consist of copper and the intermediate layer consists of nickel, each such layer having a thickness of from about 2.5 to about 35 microns.

4. The method of claim 3 in which the copper layers are compressive stressed and the nickel layer is tensile stressed.

5. In a printed circuit board having a multiplicity of through holes, a through hole plating having increased heat shock resistance comprising at least two layers of an internally stressed electrically conductive metal, each said layer having a thickness of from about 2.5 to about 35 microns, in combination with at least one intermediate layer of another electrically conductive metal having an internal stress in counteraction to that of said other metal layers.

6. The printed circuit board of claim 5 in which the metal of the through hole plating is selected from among copper, nickel, gold and tin.

7. A printed circuit board having improved resistance to heat shock in which the through hole plating comprising a three-layered arrangement consisting of a first and third layers of copper and an intermediate layer of nickel, each such layer having a thickness of from about 2.5 to about 35 microns.

8. The printed circuit board of claim 7 in which the copper layers are compressive stressed and the nickel layer is tensile stressed.

9. A printed circuit board assembly comprising
  (a) an insulating base having a plurality of through holes defining interconnecting points;
  (b) a printed circuit pattern on one or both sides of the insulating base; and
  (c) a plating on the walls of the through holes comprising a first and third layers consisting of copper and an intermediate layer consisting of nickel, each of said first and third copper layers and said nickel layer having a thickness of from about 2.5 to about 35 microns.

* * * * *